(12) United States Patent
Matsui

(10) Patent No.: US 9,947,607 B2
(45) Date of Patent: Apr. 17, 2018

(54) INVERTER

(71) Applicant: FUJI ELECTRIC CO., LTD., Kawasaki (JP)

(72) Inventor: Kohei Matsui, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/332,442

(22) Filed: Oct. 24, 2016

(65) Prior Publication Data

US 2017/0162465 A1  Jun. 8, 2017

(30) Foreign Application Priority Data

Dec. 4, 2015 (JP) .................. 2015-237446

(51) Int. Cl.
| | |
|---|---|
| H01L 23/34 | (2006.01) |
| H01L 23/36 | (2006.01) |
| H01L 23/42 | (2006.01) |
| H01L 23/467 | (2006.01) |
| H02M 7/00 | (2006.01) |
| H01L 23/367 | (2006.01) |
| H01L 23/373 | (2006.01) |

(52) U.S. Cl.
CPC ...... *H01L 23/3675* (2013.01); *H01L 23/3737* (2013.01); *H02M 7/003* (2013.01); *H01L 23/34* (2013.01); *H01L 23/36* (2013.01); *H01L 23/367* (2013.01); *H01L 23/42* (2013.01); *H01L 23/467* (2013.01)

(58) Field of Classification Search
CPC ......... H01L 23/34; H01L 23/36; H01L 23/42; H01L 23/3675; H01L 23/467; H01L 23/367; H02M 7/003
See application file for complete search history.

(56) References Cited

U.S. PATENT DOCUMENTS

| | | | | |
|---|---|---|---|---|
| 4,520,425 | A * | 5/1985 | Ito ...................... | H05K 7/20918 165/80.2 |
| 5,940,272 | A * | 8/1999 | Emori ................ | H05K 7/20927 165/185 |
| 9,653,379 | B2 * | 5/2017 | Koyama ............... | H01L 23/473 |
| 2013/0249100 | A1 * | 9/2013 | Morishita .............. | H01L 23/13 257/772 |
| 2015/0371921 | A1 * | 12/2015 | Tanaka ................. | H01L 21/565 257/712 |
| 2016/0064303 | A1 * | 3/2016 | Ninomiya ............ | H01L 23/473 165/80.4 |

FOREIGN PATENT DOCUMENTS

JP   2000-14169   1/2000

* cited by examiner

*Primary Examiner* — David Zarneke

(57) ABSTRACT

An inverter includes: an inverter circuit including: a power semiconductor module; and an inverter circuit module including a passive component; a cooler including a cooler surface to which the power semiconductor module is joined; an inverter case sealing the inverter circuit with the cooler surface of the cooler; and a sealed heat insulating layer being formed on the cooler surface of the cooler and having a thickness that is equal to or less than a maximum convection suppressing distance.

9 Claims, 4 Drawing Sheets

INVERTER

CROSS-REFERENCE TO RELATED APPLICATION(S)

The present application claims priority to and incorporates by reference the entire contents of Japanese Patent Application No. 2015-237446 filed in Japan on Dec. 4, 2015.

BACKGROUND

1. Technical Field

The disclosure relates to an inverter.

2. Related Art

Conventionally, an inverter that drives motors of various kinds of devices has been required to reduce size and weight in order to reduce cost and to be installed in an electrical room having a limited space. When an inverter is used outdoor or in a factory environment having dust and the like, high sealing performance is required for obtaining high dust proofing and water proofing property such as IP66 as environment-resistant performance.

In an inverter, a power semiconductor element that controls current flowing into a motor generates heat due to conduction loss upon application of current and switching loss occurring in transition of on/off. For these reasons, an air-cooled cooler and a water-cooled cooler are attached to an inverter in order to reduce heat generated by a power semiconductor element. However, in an inverter with, for example, an air-cooled cooler, a structural member of the air-cooled cooler occupies a large volume. There may be a case where a structural member of an air-cooled cooler occupies a volume ten times as large as or more than that of a power semiconductor module depending on setting conditions.

To reduce the size of an inverter, reduction in the size of a cooler is required. The size of a cooler can be reduced by reducing loss of a power semiconductor element and making a power semiconductor element usable at a higher temperature. Loss of a power semiconductor element can be reduced by advance of the power semiconductor element. Making a power semiconductor element usable at a higher temperature largely depends on advance of a package technique such as highly reliable bond including solder. Today, a maximum junction temperature of a power semiconductor element is 175 degrees Celsius, and there are power semiconductor elements having an allowable junction temperature in continuous driving up to 175 degrees Celsius.

SUMMARY

If the size of an inverter is reduced, a distance between a high-temperature power semiconductor module or a cooler and a passive component including an electrolytic capacitor becomes short in the inverter, and a temperature of the passive component increases.

A passive component does not have the same heat resistance as a power semiconductor module does. An increase in temperature causes degradation of reliability and shortening of life.

In particular, life of an electrolytic capacitor as a passive component is determined by an ambient temperature. Life follows the Arrhenius's law, and life is considered to be halved as a temperature becomes 10 degrees Celsius higher.

An inverter with a sealed case satisfying a high sealing performance as specified in IP66 cannot inhale the outside air, and thus the case keeps heat, which is generated in an inverter circuit, inside the case. The heat includes heat that a power semiconductor element generates. Namely, an inverter with a sealed case tends to have a high temperature in the case as compared to that of an inverter with an open-type case.

In order to reduce an increase in temperature of the inside of an inverter case in which an inverter circuit including an electrolytic capacitor is installed except for a power semiconductor module, Japanese Patent Application Laid-open No. 2000-14169 discloses an inverter having a space between a cooler and the inside of the inverter case, the power semiconductor module being installed on the cooler, the inverter circuit being installed on the inside of the inverter case, the inverter being configured to intensively cause outside air to flow into the space by natural convection and forced air cooling.

However, the inverter disclosed in Japanese Patent Application Laid-open No. 2000-14169 is not intended to be completely sealed as specified in IP66, and, if a space between the cooler in which the power semiconductor module is installed and the inside of the inverter case in which the inverter circuit is installed is sealed, outside air is not allowed to flow into this space. In this space, convection occurs in internal air heated to a high temperature due to heat generated by the power semiconductor module. Convective heat conduction in this internal air causes heat of the cooler to be conducted to the inside of the inverter case. Accordingly, a temperature in the inverter case increases, and life of the inverter circuit serving as a passive component including an electrolytic capacitor is shortened.

In view of the foregoing, it is desirable to provide an inverter capable of reducing, even when the whole device is covered with a sealed case, an increase in temperature of a passive component in the sealed case.

According to one aspect of the present disclosure, there is provided an inverter including: an inverter circuit including: a power semiconductor module; and an inverter circuit module including a passive component; a cooler including a cooler surface to which the power semiconductor module is joined; an inverter case sealing the inverter circuit with the cooler surface of the cooler; and a sealed heat insulating layer being formed on the cooler surface of the cooler and having a thickness that is equal to or less than a maximum convection suppressing distance.

The above and other objects, features, advantages and technical and industrial significance of this invention will be better understood by reading the following detailed description of presently preferred embodiments of the invention, when considered in connection with the accompanying drawings.

DETAILED DESCRIPTION

Embodiments of the present disclosure will now be described with reference to the accompanying drawings.

Figure 1:
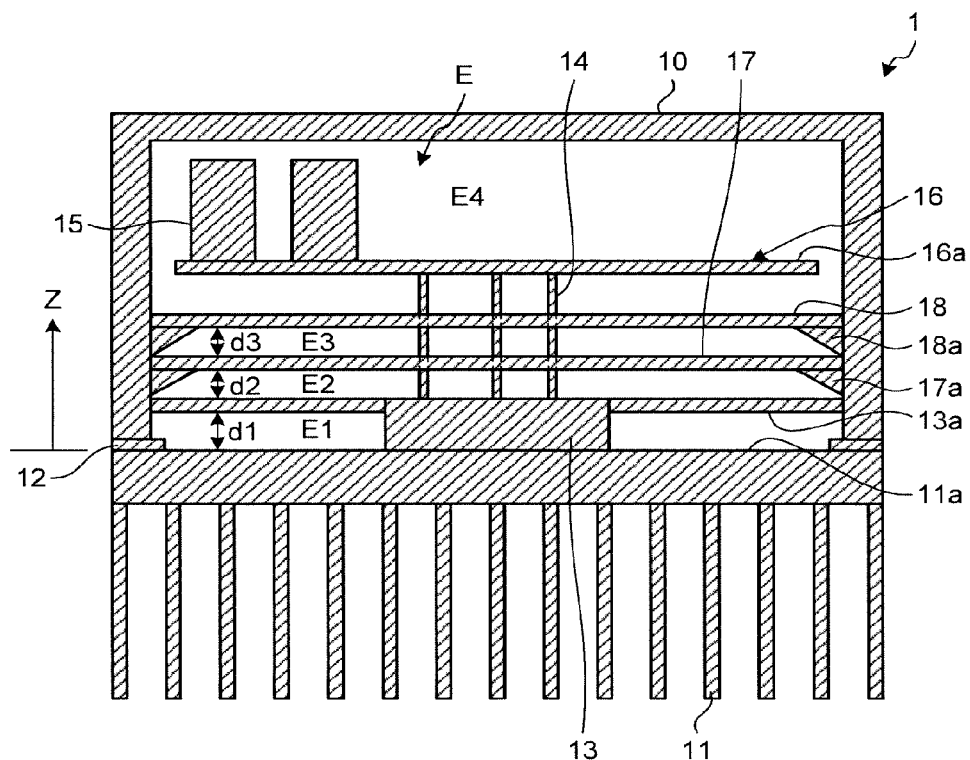
FIG. 1 is a sectional view illustrating an inverter according to an embodiment of the present disclosure.

FIG. 1 is a sectional view illustrating an inverter according to an embodiment of the present disclosure. In an inverter 1 of FIG. 1, a sealed space E satisfying a high sealing performance as specified in IP66 is formed between an inverter case 10 and a cooler surface 11a of a cooler 11. The inverter case 10 and the cooler surface 11a are sealed by a packing 12.

A power semiconductor module 13 and an inverter circuit module 16 that is connected to the power semiconductor module 13 through wiring 14 and that includes passive components such as an electrolytic capacitor 15 are disposed in the sealed space E. The power semiconductor module 13 is strongly joined to the cooler surface 11a by a screw and the like, and is cooled by heat radiation through cooling fins. The power semiconductor module 13 is a module that includes heat generating elements such as a rectifier diode and a semiconductor switching element in the inverter circuit, and is disposed apart from the inverter circuit module 16.

In FIG. 1, a gravity direction is represented as -Z direction. Generally, most of heat generated by the power semiconductor module 13 is headed to the cooler 11, and a temperature of the cooler 11 increases. Convection occurs in the inverter case 10 due to a temperature difference between a temperature of the cooler surface 11a of the cooler 11 and an air temperature in the inverter case 10, and a temperature in the inverter case 10 increases.

In the embodiment, the sealed space E is divided into four sealed spaces E1 to E4. The sealed space E1 is a space surrounded by the cooler surface 11a, a substrate 13a of the power semiconductor module 13 that is disposed facing the cooler surface 11a, and the inverter case 10. An air layer as a heat insulating material is formed in the sealed space E1, and functions as a sealed heat insulating layer that suppresses heat conduction from the cooler surface 11a.

The sealed space E2 is a space surrounded by the substrate 13a, a convection suppressing plate 17, and the inverter case 10. An air layer as a heat insulating material is formed in the sealed space E2, and functions as a sealed heat insulating layer that suppresses heat conduction from the sealed space E1. The convection suppressing plate 17 is positioned by a projection 17a for positioning attached to the inverter case 10.

The sealed space E3 is a space surrounded by the convection suppressing plate 17, a convection suppressing plate 18, and the inverter case 10. An air layer as a heat insulating material is formed in the sealed space E3, and functions as a sealed heat insulating layer that suppresses heat conduction from the sealed space E2. The convection suppressing plate 18 is positioned by a projection 18a for positioning attached to the inverter case 10.

The sealed space E4 is a space surrounded by the convection suppressing plate 18 and the inverter case 10. The sealed space E4 is a space most isolated from the power semiconductor module 13, the sealed space E1, and the cooler 11, and has the inverter circuit module 16 disposed therein. The inverter circuit module 16 includes a substrate 16a. The substrate 16a and the substrate 13a are connected through the wiring 14. The wiring 14 is connected by passing through the convection suppressing plates 17 and 18. The convection suppressing plates 17 and 18 are preliminarily provided with through-holes through which the wiring 14 passes, and the convection suppressing plates 17 and 18 and the wiring 14 are bonded through the through-holes in assembling.

Figure 2:
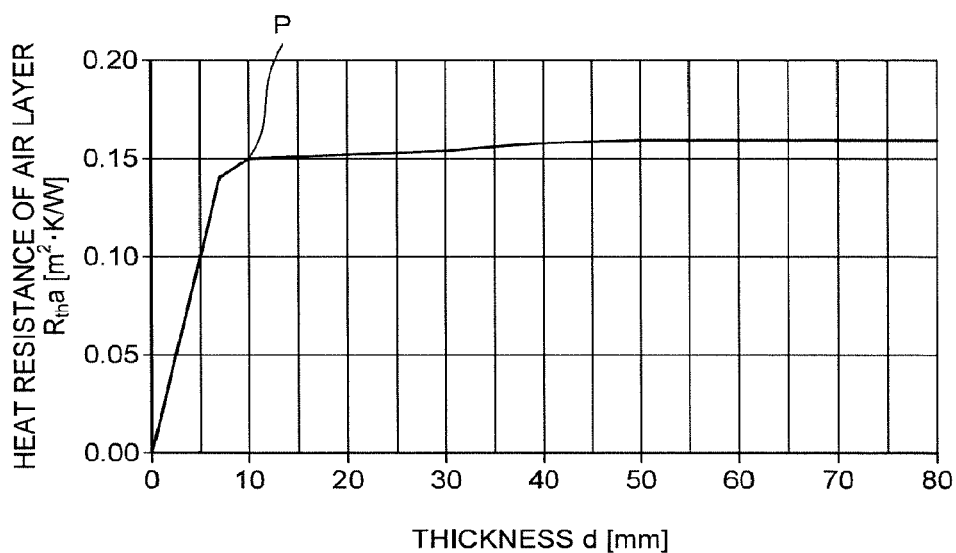
FIG. 2 is a view illustrating change in heat resistance of an air layer depending on the thickness of the air layer.

Each thickness d1, thickness d2, and thickness d3 of the sealed spaces E1, E2, and E3 is equal to or less than a maximum convection suppressing distance d where convection does not occur in each of the sealed spaces E1 to E3. When the power semiconductor module 13 as a heat source is disposed on the lower side in the inverter case 10 in a gravity direction, heat resistance Rtha [$m^2 \cdot K/W$] of an air layer depends on thickness d as illustrated in FIG. 2. Heat resistance Rtha increases as the thickness d increases until the thickness d reaches a point P of 10 mm, but the heat resistance Rtha saturates and does not increase after the thickness d exceeds 10 mm. This is because when the thickness d exceeds 10 mm, occurrence of convection makes apparent heat conduction large and, and thus the heat resistance Rtha does not increase. In other words, convection does not occur in an air layer until the thickness d becomes 10 mm, which means that heat insulating performance is highly maintained. Thus, in each of the thickness d1, the thickness d2, and the thickness d3 of the sealed spaces E1, E2, and E3, the maximum convection suppressing distance d is equal to or less than 10 mm. The larger each of the thickness d1, the thickness d2, and the thickness d3 is, the higher heat insulating performance of each of the sealed spaces E1 to E3 is. Accordingly, each of the thickness d1, the thickness d2, and the thickness d3 is preferably 10 mm.

The substrate 13a and the convection suppressing plates 17 and 18 have heat insulating performance. A resin film which is easily processable and foldable is used as the convection suppressing plates 17 and 18 because the convection suppressing plates 17 and 18 do not require strength. The resin is preferably engineering plastics and super engineering plastics having heat resistance.

Metal may be used for the convection suppressing plates 17 and 18. When aluminum is used for the convection suppressing plates 17 and 18, they preferably have a surface alumite-treated with a resulting surface emissivity of 0.8 or more. When other metal is used for the convection suppressing plates 17 and 18, it is preferable that surface treatment such as plating be applied and surface emissivity be 0.8 or more. Surface emissivity of resin, wood, paper, or others is equal to or more than 0.8.

If surface emissivity is equal to or more than 0.8, received heat is not transferred to an air layer, and efficiency of dissipating heat by radiation is improved. When surface emissivity is equal to or more than 0.8, heat is radiated to the inverter case 10, and the heat can be dissipated directly from the inverter case 10 to the outside. Thus, surface emissivity of a surface of the inverter case 10 is preferably equal to or more than 0.8.

Figure 3:
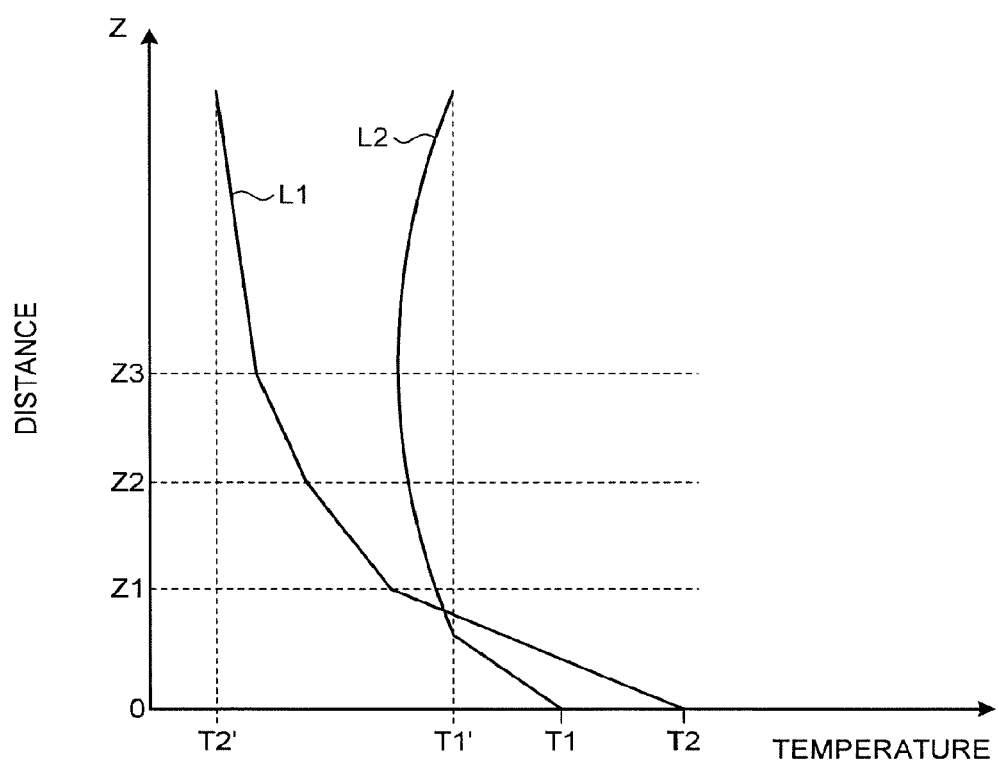
FIG. 3 is a view illustrating temperature distribution of the inside of the inverter illustrated in FIG. 1.

FIG. 3 is a view illustrating a change in temperature in the sealed space E ranged from the cooler surface 11a to a distance Z. In FIG. 3, a curved line L1 indicates a change in temperature in the case of the configuration illustrated in FIG. 1, and a curved line L2 indicates a change in temperature in the case of the conventional configuration where there are no sealed spaces E1 to E3. Distances Z1 to Z3 correspond to positions of the substrate 13a, the convection suppressing plate 17, and the convection suppressing plate 18, respectively. As illustrated in FIG. 3, in the present embodiment where there is the sealed space E1, a temperature in the vicinity of the cooler surface 11a is a temperature T2, and is high as compared to a temperature T1 of the conventional configuration. However, in the present embodiment, heat insulating performance of the sealed spaces E1 to E3 causes a temperature to gradually decrease toward the sealed spaces E1 to E4, and a temperature in the sealed space E4 eventually becomes T2'. By contrast, in the case of the conventional configuration where there are no sealed spaces E1 to E3, occurrence of convection causes air of high temperature to pool in the upper part in the Z direction, and causes a temperature in the inverter case 10 to increase. In the conventional configuration, a temperature in the sealed space E4 becomes T1'. In this manner, the temperature T2' in the sealed space E4 of the present embodiment can be a low temperature as compared to the temperature T1' of the conventional configuration.

First Modification

Figure 4:
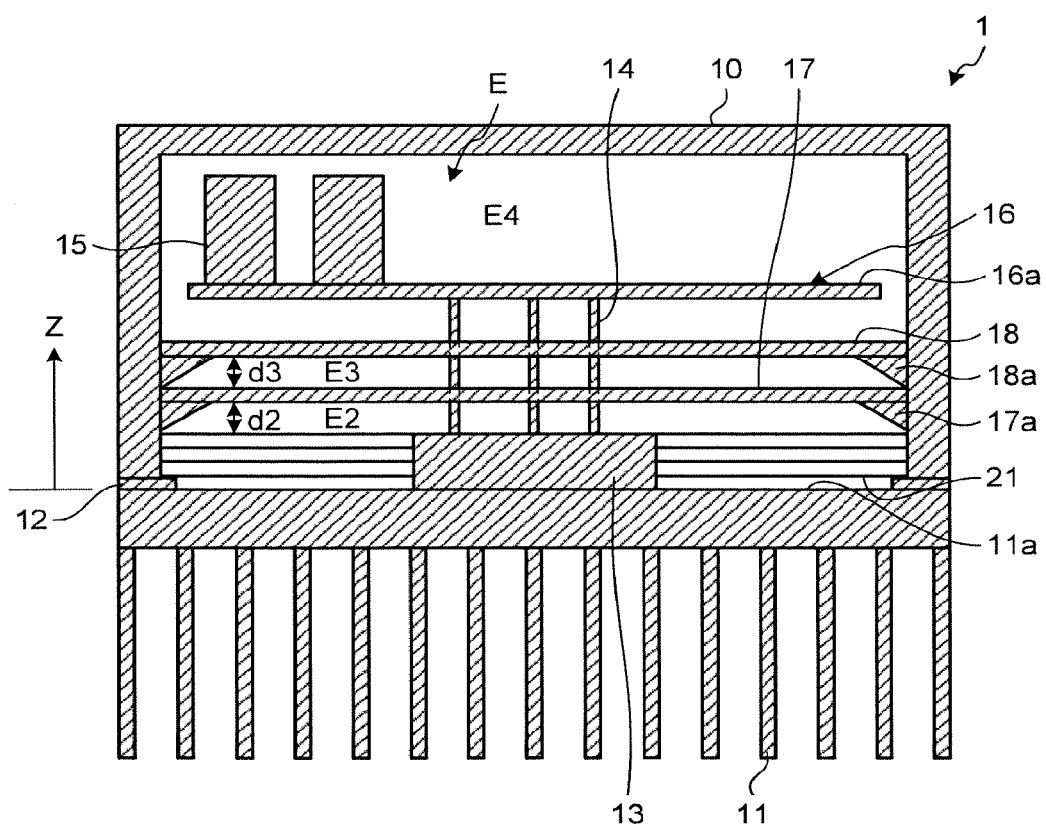
FIG. 4 is a sectional view illustrating the inverter according to a first modification of the embodiment of the present disclosure.

FIG. 4 is a sectional view illustrating the inverter according to a first modification of the embodiment of the present disclosure. In FIG. 4, a gravity direction is also represented as -Z direction. In the embodiment, the sealed space E1 is formed by using the substrate 13a, but in the first modification, insulating sheets 21 are superposed in a space corresponding to the sealed space E1. The first modification is effective when the power semiconductor module 13 does not have the substrate 13a or when the substrate 13a is not extended to the inverter case 10.

As illustrated in FIG. 4, the insulating sheets 21 form a plurality of sealed heat insulating layers having the maximum convection suppressing distance d or less in a space corresponding to the sealed space E1. In each of the insulating sheets 21, a hole that passes through the power semiconductor module 13 disposed on the cooler surface 11a is formed. If materials of members (the insulating sheets 21 and the convection suppressing plates 17 and 18) forming the sealed heat insulating layers are formed with fordable thickness or formed of fordable materials, processing is facilitated.

The plurality of insulating sheets 21 are not necessarily provided, and one insulating sheet 21 corresponding to the substrate 13a may be provided. In this manner, the insulating sheet 21, the cooler surface 11a, and the inverter case 10 form the same sealed space E1 as that of the embodiment. In this case, the insulating sheet 21 is bonded to the power semiconductor module 13 and the inverter case 10.

Second Modification

Figure 5:
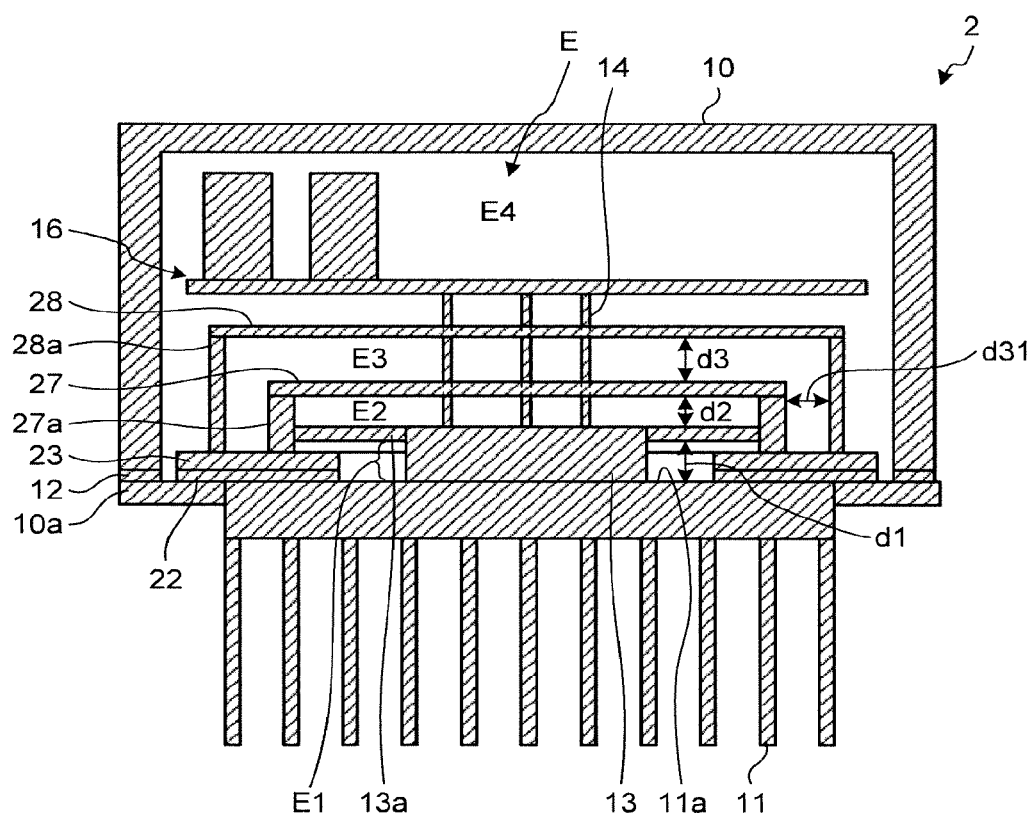
FIG. 5 is a sectional view illustrating an inverter according to a second modification of the embodiment of the present disclosure.

FIG. 5 is a sectional view illustrating an inverter according to a second modification of the embodiment of the present disclosure. In FIG. 5, a gravity direction is also represented as -Z direction. In the second modification, the sealed spaces E3 and E4 cover the power semiconductor module 13 and the cooler surface 11a. This configuration is suitable when a width of the inverter case 10 is large as compared to that of the cooler surface 11a.

As illustrated in FIG. 5, a frame 10a corresponding to a width of the inverter case 10 is attached around the cooler surface 11a of an inverter 2. The packing 12 is provided between the inverter case 10 and the frame 10a and seals the inverter case 10 and the frame 10a. A packing 22 is provided to a connection part of the cooler surface 11a and the frame 10a, and seals the connection part. A lower surface case 23 is provided to the upper part of the packing 22. A convection suppressing column 27a for forming the sealed space E2 and a convection suppressing column 28a for forming the sealed space E3 are vertically disposed on the lower surface case 23. The upper end of the convection suppressing column 27a is covered with a convection suppressing plate 27. The upper end of the convection suppressing column 28a is covered with a convection suppressing plate 28.

The sealed space E1 is a space surrounded by the cooler surface 11a, the substrate 13a of the power semiconductor module 13, and a part of the lower part of the convection suppressing column 27a. The sealed space E2 is a space surrounded by the convection suppressing plate 27, the substrate 13a, and a part of the upper part of the convection suppressing column 27a. The sealed space E3 is a space surrounded by the convection suppressing plate 28, the convection suppressing plate 27, the convection suppressing column 28a, and the convection suppressing column 27a, and is a space having a U-shaped cross section with a lower part open. The sealed space E4 is a space surrounded by the inverter case 10, the convection suppressing plate 28, the convection suppressing column 28a, and the frame 10a, and is a space having a U-shaped cross section with a lower part open.

Each thickness d1, thickness d2, thickness d3, and thickness d31 is equal to or less than the maximum convection suppressing distance d. Similarly to the embodiment, each of the sealed spaces E1 to E3 has high heat insulating performance because convection does not occur in each of the sealed spaces E1 to E3.

The convection suppressing column 28a is preferably provided outside the cooler surface 11a. In other words, the sealed space E4 and the cooler surface 11a are preferably arranged so that they are not directly contacted with each other.

Similarly to the first modification, the insulating sheets 21 may be superposed in the sealed space E1, and the insulating sheets 21 may be provided in place of the substrate 13a.

In the embodiment and the first and second modifications, each of the sealed spaces E1 to E3 may be further divided. For example, the sealed space E3 in the second modification may be divided in a width direction and a height direction.

In the embodiment and the first and second modifications, the sealed spaces E1 to E3 serving as three sealed heat insulating layers are formed, but at least the sealed space E1 serving as one sealed heat insulating layer may be formed. However, the sealed spaces E1 and E2 are preferably formed because the sealed space E1 preferably covers the power semiconductor module 13. When the thickness of the power semiconductor module 13 is less than the maximum convection suppressing distance d, the sealed space E1 is not necessarily formed, and the sealed spaces E1 and E2 may be defined as one sealed space.

Furthermore, the sealed space E1 is preferably air having high heat insulating performance, but the sealed space E1 may be filled with a heat insulating material such as glass wool.

The sealed spaces E1 to E3 may be in a vacuum state. High heat insulating performance is improved because convection does not occur in a vacuum state. However, considering degradation of a vacuum state, thickness is preferably equal to or less than the maximum convection suppressing distance d.

Furthermore, the inverters 1 and 2 may be installed in any direction. In other words, a thickness direction of the sealed spaces E1 to E3 may be a vertical direction, and may be a horizontal direction. In any case, convection does not occur in a thickness direction, and accordingly, convection does not occur in the sealed spaces E1 to E3.

In recent years, a wide band gap semiconductor such as a silicon carbide (SiC) power semiconductor has been attracting attention as a next-generation device. A wide band gap semiconductor is made of silicon carbide, gallium nitride, diamond, and the like, has a high potential of loss reduction as compared to a silicon (Si) power semiconductor that has nearly reached a limit of loss reduction, and is made usable even when a junction temperature is equal to or more than 200 degrees Celsius. When a wide band gap power semiconductor such as a SiC power semiconductor is applied to an inverter, the size of the inverter can be dramatically reduced as compared to the case where a Si power semiconductor is used. Thus, a power semiconductor element of the power semiconductor module 13 is preferably a wide band gap power semiconductor element.

In the embodiment and the first and second modifications, even when a power semiconductor module is used at a high temperature and the size of a cooler is reduced in an inverter with a sealed case, an increase in temperature of a passive component including an electrolytic capacitor can be reduced by the sealed spaces E1 to E3 serving as sealed heat insulating layers. Accordingly, life of the passive component can be extended, and reliability of the passive component can be improved.

As described above, according to the present disclosure, in an inverter sealing an inverter circuit that includes a power semiconductor module and an inverter circuit module including a passive component with a cooler surface of a cooler to which the power semiconductor module is joined and an inverter case, a sealed heat insulating layer is formed on the cooler surface of the cooler, and the thickness of the sealed heat insulating layer is made equal to or less than a maximum convection suppressing distance so as not to generate convection in the sealed heat insulating layer. In this manner, the inverter can maintain excellent performance by which the passive component side is insulated from the heat from the cooler surface, and prevent life of the passive component from being shortened due to heat.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An inverter comprising:
   an inverter circuit including:
      a power semiconductor module; and
      an inverter circuit module including a passive component;
   a cooler including a cooler surface to which the power semiconductor module is joined;
   an inverter case sealing the inverter circuit with the cooler surface of the cooler; and
   a sealed heat insulating layer being formed on the cooler surface of the cooler and having a thickness that is equal to or less than a maximum convection suppressing distance.

2. The inverter according to claim 1, wherein the sealed heat insulating layer is an air layer.

3. The inverter according to claim 1, wherein the sealed heat insulating layer has a plurality of sealed heat insulating layers disposed in two or more layers.

4. The inverter according to claim 1, wherein the sealed heat insulating layer is formed so as to cover the power semiconductor module.

5. The inverter according to claim 1, wherein a material of a member that seals and forms the sealed heat insulating layer has a foldable thickness or is a foldable material.

6. The inverter according to claim 1, wherein a material of a member that seals and forms the sealed heat insulating layer is resin.

7. The inverter according to claim 1, wherein a material of a member that seals and forms the sealed heat insulating layer is aluminum, and has a surface alumite-treated.

8. The inverter according to claim 1, wherein a material of a member that seals and forms the sealed heat insulating layer, and a material that forms the inverter case have a surface emissivity of 0.8 or more.

9. The inverter according to claim 1, wherein a power semiconductor element in the power semiconductor module is a wide band gap semiconductor element.

* * * * *